(12) United States Patent
Wu

(10) Patent No.: US 8,263,464 B2
(45) Date of Patent: Sep. 11, 2012

(54) SYSTEMS AND METHODS FOR MEMORY STRUCTURE COMPRISING A PPROM AND AN EMBEDDED FLASH MEMORY

(75) Inventor: Chao I Wu, Hsinchu (TW)

(73) Assignee: Macronix International Co., Ltd. (TW)

( * ) Notice: Subject to any disclaimer, the term of this patent is extended or adjusted under 35 U.S.C. 154(b) by 46 days.

(21) Appl. No.: 12/791,508

(22) Filed: Jun. 1, 2010

(65) Prior Publication Data

US 2010/0304541 A1    Dec. 2, 2010

Related U.S. Application Data

(62) Division of application No. 11/203,708, filed on Aug. 15, 2005, now Pat. No. 7,755,129.

(51) Int. Cl.
*H01L 21/336*    (2006.01)

(52) U.S. Cl. .................. 438/287; 438/197; 438/761

(58) Field of Classification Search .................. 438/197, 438/287, 761
See application file for complete search history.

(56) References Cited

U.S. PATENT DOCUMENTS

| | | |
|---|---|---|
| 6,011,725 A | 1/2000 | Eitan |
| 6,420,215 B1 | 7/2002 | Knall et al. |
| 2004/0214379 A1 | 10/2004 | Lee et al. |

OTHER PUBLICATIONS

Graaf, et al., "A Novel High-Density Low-Cost Diode Programmable Read Only Memory," IEEE, pp. 7.6.1-7.6.4 (1996).

*Primary Examiner* — Long Pham
(74) *Attorney, Agent, or Firm* — Baker & McKenzie LLP

(57) ABSTRACT

A memory structure that combines embedded flash memory and PPROM. The PPROM can be used as a memory structure. The flash memory can be used, e.g., as air replacement cells or back up memory, or additional memory cells. The PPROM cells are stacked on top of the flash memory cells and the PPROM density can be increased by implementing three-dimensional PPROM structures.

13 Claims, 14 Drawing Sheets

1. PR remove
2. Oxide dep.
3. Oxide etch back
4. Thin Oxide dep.
5. Poly dep (P-type)
6. PR dep.
7. PHOTO define
8. Poly etch

(12)  United States Patent

SYSTEMS AND METHODS FOR MEMORY STRUCTURE COMPRISING A PPROM AND AN EMBEDDED FLASH MEMORY

CROSS-REFERENCE TO RELATED APPLICATION

This application is a divisional application of U.S. patent application Ser. No. 11/203,708, filed Aug. 15, 2005, and entitled "Systems and Methods for Memory Structure Comprising a PPROM and an Embedded Flash Memory. This applications is hereby incorporated by reference for all purposes.

BACKGROUND

1. Field of the Invention

The invention relates generally to memory structures, and more particularly to the design, fabrication, and use of memory structures that combine embedded flash memory and Physical Programmable Read-Only Memory (PPROM) structures.

2. Background of the Invention

Because of its small size and low cost, PPROM Technology is used in many conventional memory applications. In order to further increase the density of PPROM memory devices, three-dimensional PPROM structures can be used. In a three-dimensional PPROM structure, layers of PPROM cells are stacked on top of each other. In general, several techniques can be used to create three-dimensional PPROM structures; however, these approaches are well known and will not be discussed herein beyond the approaches used in the embodiments described below.

Many conventional memory devices also use flash memory cells. Many conventional flash memory cells use floating gate technology to store one or more bits of information in the floating gate when program voltages are applied. The operation of floating gate flash memory devices is well known and will not be discussed herein for the sake of brevity. More recently, however, floating gate technology has been displaced by the use of other technologies that can be scaled to meet increasing memory density demands. For example, SONOS technology has become more prevalent in many applications. In a SONOS cell, the cell comprises a silicon layer (S), an oxide layer (O), a nitride layer (N), another oxide layer (O), and another silicon layer (S). A programming voltage applied to the SONOS stack causes a bit of data, or a charge, to be stored in the nitride layer. Then applying the appropriate read voltages to a SONOS cell, it can be determined whether the cell has been programmed.

While there have been advancements in conventional memory cell design, such as the development of PPROM and SONOS flash memory, new applications are constantly driving new memory requirements that cannot necessarily be met by the use of conventional memory structures. As such demands are likely to continue, and even increase, in the future, it is important to develop new techniques for memory structure design and fabrication.

SUMMARY

A memory structure that combines embedded flash memory and PPROM. The PPROM can be used as a memory structure. The flash memory can be used, e.g., as error replacement cells or back up memory, or additional memory cells.

In one aspect, the PPROM cells are stacked on top of the flash memory cells.

In another aspect, the PPROM density can be increased by implementing three-dimensional PPROM structures.

These and other features, aspects, and embodiments of the invention are described below in the section entitled "Detailed Description."

BRIEF DESCRIPTION OF THE DRAWINGS

Features, aspects, and embodiments of the inventions are described in conjunction with the attached drawings, in which.

DETAILED DESCRIPTION OF THE PREFERRED EMBODIMENTS

The systems and methods described below are directed to memory structures that combine PPROM cells with flash memory cells. In the embodiments described, the flash memory cells are generally SONOS cells; however, this should not necessarily be seen as limiting the systems and methods described herein to the use of SONOS cells.

It will be clear that other, and future, flash cell structures can be used with the systems and methods described herein in order to achieve the benefits described. Further, while certain specific embodiments of memory structures combining PPROM and flash cells are described below, the specific embodiments described should not be seen as limiting the systems and methods described herein to any particular architecture or design. It will be clear that other combinations, stacking, and arrangements of PPROM and flash memory cells are possible.

Figure 1:
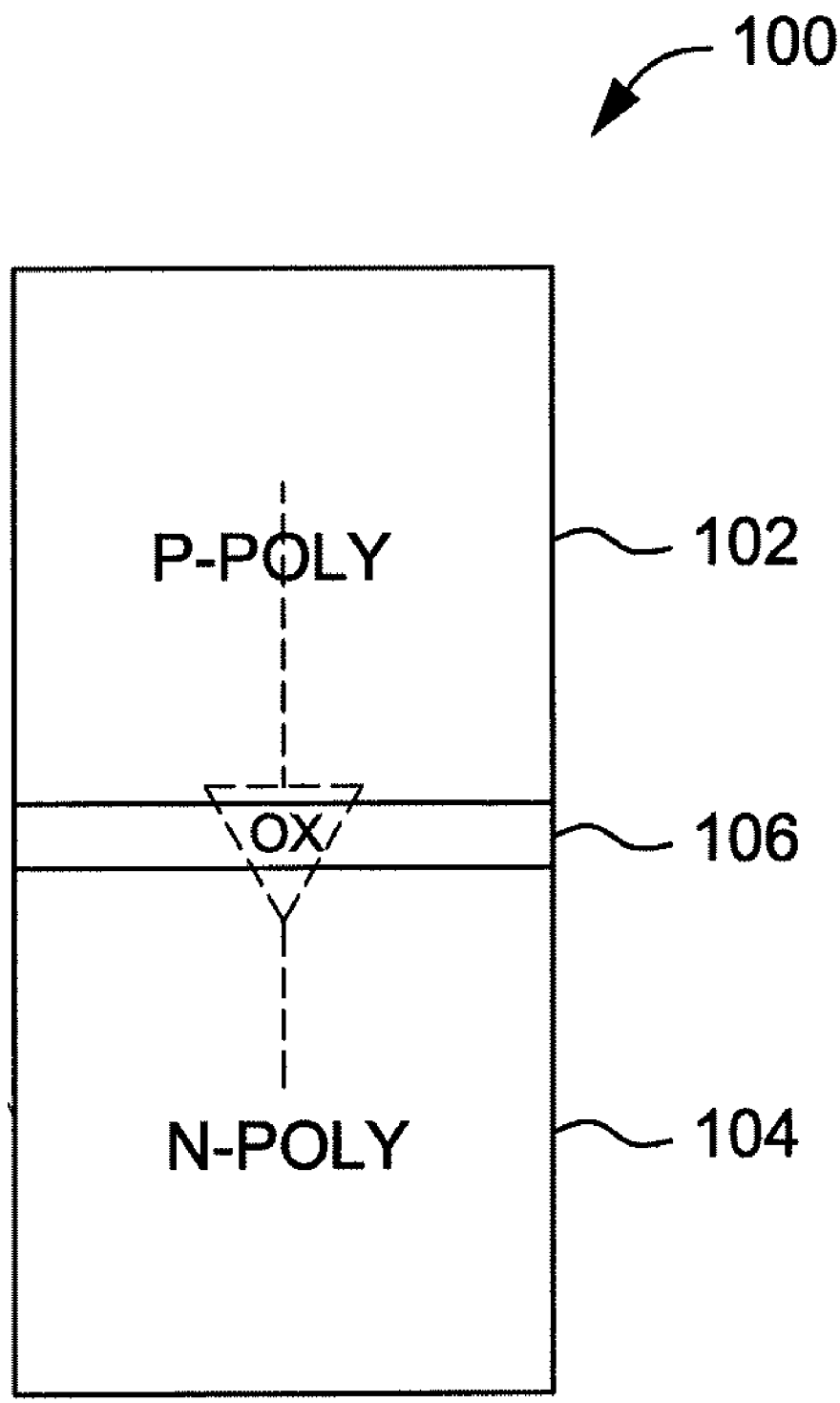
FIG. 1 is diagram illustrating an exemplary poly diode.

As mentioned above PPROM structures can be preferred for their compact size and low cost. Also as explained above, a PPROM structure is programmed by applying appropriate program voltages to the PPROM cell, which then creates a diode within the cell. Poly-diode 100 illustrated in FIG. 1 is an example of a conventional PPROM cell. As can be seen, poly-diode 100 comprises a P-type poly-silicon layer 102 and an N-type poly-silicon layer 104, separated by an oxide layer 106. When appropriate programming voltages are applied to poly-diode 100, a breach is created in oxide layer 106. The programming voltage is typically a high voltage applied between P-type poly-silicon layer 102 and N-type poly-silicon layer 104. For example, a relatively high voltage, such as 5-20 volts, can be applied between the two conductors. This can be affected by connecting N-type poly-silicon layer 104 to ground and applying a, e.g., a 5-20 volt programming voltage to P-type poly-silicon layer 102. Alternatively, N-type poly-silicon layer 104 can be coupled with a negative voltage, while P-type poly-silicon layer is coupled with a positive voltage. When no voltage is applied across poly-diode 100 then the oxide layer is not breached and a diode is not formed.

Thus, by selecting cells and applying a program voltage, or voltages, diodes can be selectively formed so as to program an array of poly diodes comprising a PPROM device. Often, the programming voltage is applied with a polarity such that the more positive voltage is applied to the anode of the diode while the more negative voltage is applied to the cathode; however, it is also possible to program a poly diode using a reverse biasing potential. In order to sense whether poly diode 100 has been programmed, a voltage, typically lower than that used for programming, is applied to the poly diode. The voltage is applied so as to forward bias diode 100. The forward biasing creates a current through diode 100 that can then be sensed, e.g., using a sense amplifier in order to determine whether oxide layer 106 is intact or has been breached. If oxide layer 106 is intact, i.e., meaning a diode has not been formed, then the sense amplifier will not sense any current through cell 100. If on the other hand, oxide layer 106 has been breached, then application of the read voltage will cause the diode formed in cell 100 to be forward biased, which will result in a current that can be sensed by the sense amplifier.

Figure 2A:
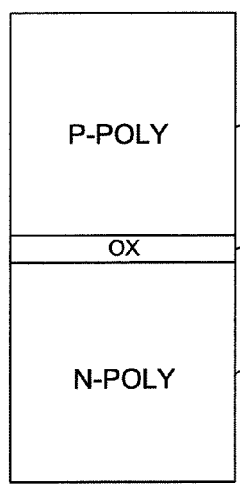
FIG. 2A is a diagram illustrating one configuration of an exemplary poly diode.
Figure 2B:
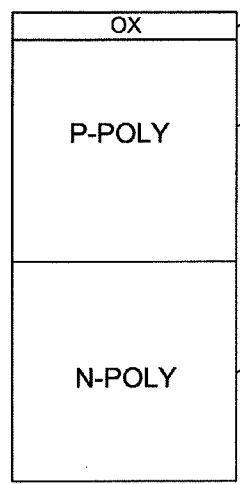
FIG. 2B is a diagram illustrating other configuration of an exemplary poly diode.
Figure 2C:
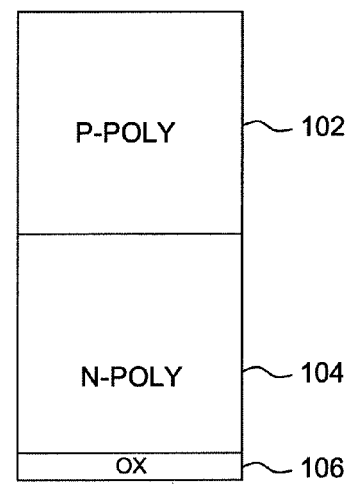
FIG. 2C is a diagram illustrating another configuration of an exemplary poly diode.

FIGS. 2a-2c illustrate various poly diode structures that can be used in accordance with the systems and methods described herein. FIG. 2a, for example, is the same as the poly diode structure illustrated in FIG. 1 comprising a P-type poly-silicon layer 102 separated from an N-type poly-silicon layer 104 by an oxide layer 106. In FIG. 2b, however, oxide layer 106 is on top of a P-type poly-silicon layer 102 which is on top of a N-type poly-silicon layer 104. In FIG. 2c, oxide layer 106 is below P-type poly-silicon layer 102 and N-type poly-silicon layer 104. It will be clear that any of the various poly-silicon structures known and/or described herein can be used in accordance with the systems and methods described below.

As mentioned, the systems and methods described herein combine PPROM with a flash memory cell such as a SONOS flash memory cell. FIGS. 3-6 illustrate various example embodiments of combined PPROM and flash memory structures designed, fabricated, and used in accordance with the systems and methods described herein. It will be apparent, however, that the systems and methods described herein are not necessarily limited to the embodiments illustrated in FIGS. 3-6. As such, the embodiments illustrated in FIGS. 3-6 are by way of example only and should not be seen as limiting the systems and methods described herein to any particular embodiment or any particular combination of PPROM and flash memory.

Figure 3:
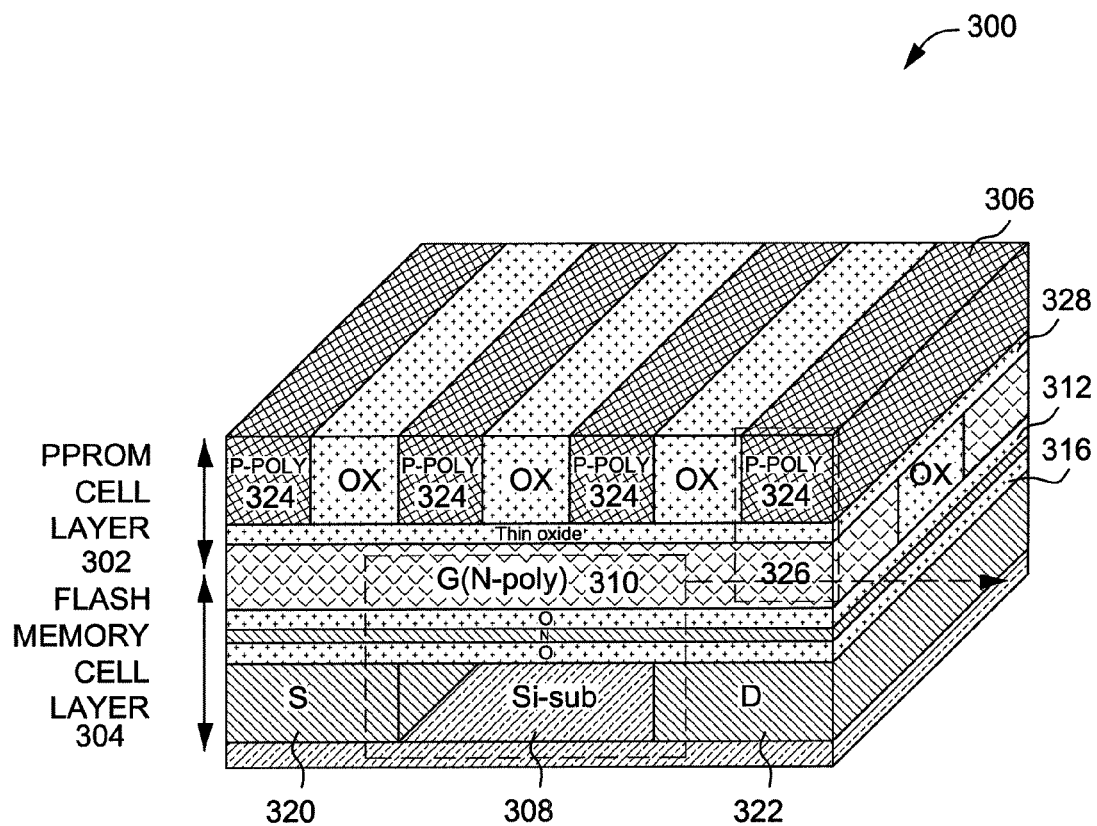
FIG. 3 is a diagram illustrating an example memory structure 300 that combines PPROM with flash memory in accordance with one embodiment.

FIG. 3 is a diagram illustrating an example memory structure 300 that combines PPROM with flash memory in accordance with one embodiment of the systems and methods described herein. As can be seen, memory structure 300 comprises a PPROM cell layer 302 and a flash memory cell layer 304. PPROM cell layer 302 comprises P-type poly-silicon layers 324, thin oxide layer 328, and N-type poly-silicon layer 310. Thus, PPROM cell layer 302 comprises individual poly diode structures 306 formed from P-type poly-silicon layer 324, the area 326 of N-type poly-silicon layer 310, that is below the corresponding P-type poly-silicon layer 324, and by thin oxide layer 328, which separates the two. In the embodiment of FIG. 3, each poly diode structure 306 is separated from adjacent poly diode structures by oxide layers 330.

Flash memory cell layer 304 also makes use of N-type poly-silicon layer 310, which is separated from a silicon substrate 318 by oxide layer 312, nitride layer 314, and oxide layer 316. Thus, in the embodiment of FIG. 3, memory structure 300 comprises a SONOS flash memory cell 308. Flash memory cell 308 also comprises a source 320 and drain 322 constructed, e.g., by implanting the appropriate type poly-silicon layers within silicon substrate 318.

Thus, as can be seen, flash memory cell 308 and poly diodes 306 share a poly-silicon line between them. In other words, N-type poly-silicon layer 310, which comprises the gate of flash memory cell 308, also forms part of poly diode 306. Such a construction, i.e., comprising a co-used poly-silicon line, can be preferred in order to reduce the size and complexity of memory structure 300. As will be illustrated below, however, other embodiments can be constructed without the use of co-used poly-silicon lines.

Figure 4:
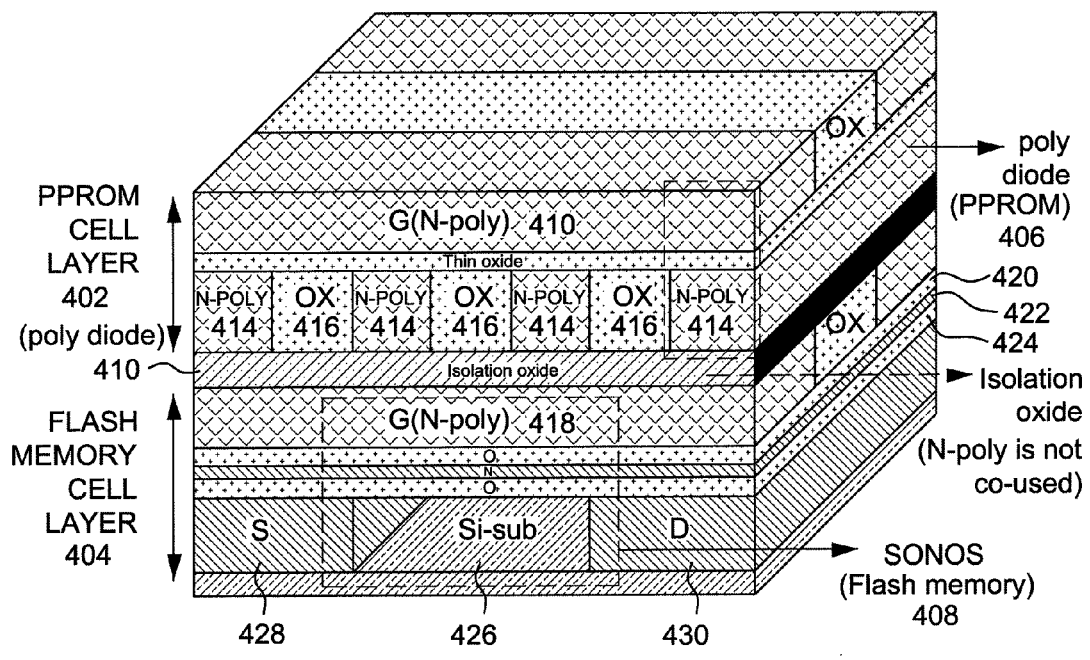
FIG. 4 is a diagram illustrating another example memory structure 300 that combines PPROM with flash memory in accordance with one embodiment.

In fact, FIG. 4 is a diagram illustrating an example memory structure 400 that does not use co-used poly-silicon lines in accordance with one embodiment of the systems and methods described herein. In structure 400, PPROM cell layer 402 is separated from flash memory cell layer 404 by an isolation oxide layer 410. Thus, each poly diode 406 comprises an area of P-type poly-silicon layer 412 above an N-type poly-silicon layer 414. The area of poly-silicon layer 412 above N-type poly-silicon layer 414 is separated from N-type poly-silicon layer 414 by thin oxide layer 418. Further, each N-type poly-silicon layer 414 is separated by an oxide layer 416.

Flash cell 408 is then formed by N-type poly layer 418, which is separated from silicon substrate 426 by oxide layer 420, nitride layer 422, and oxide layer 424. Thus, as mentioned, flash memory cell 408 is a SONOS-type memory cell. Flash memory cell 408 also comprises source 428 and drain 430 regions within silicon substrate layer 426.

As can be seen, poly diode 406 and flash cell 408 do not share a common poly-silicon line as with the embodiment illustrated in FIG. 3.

Figure 5:
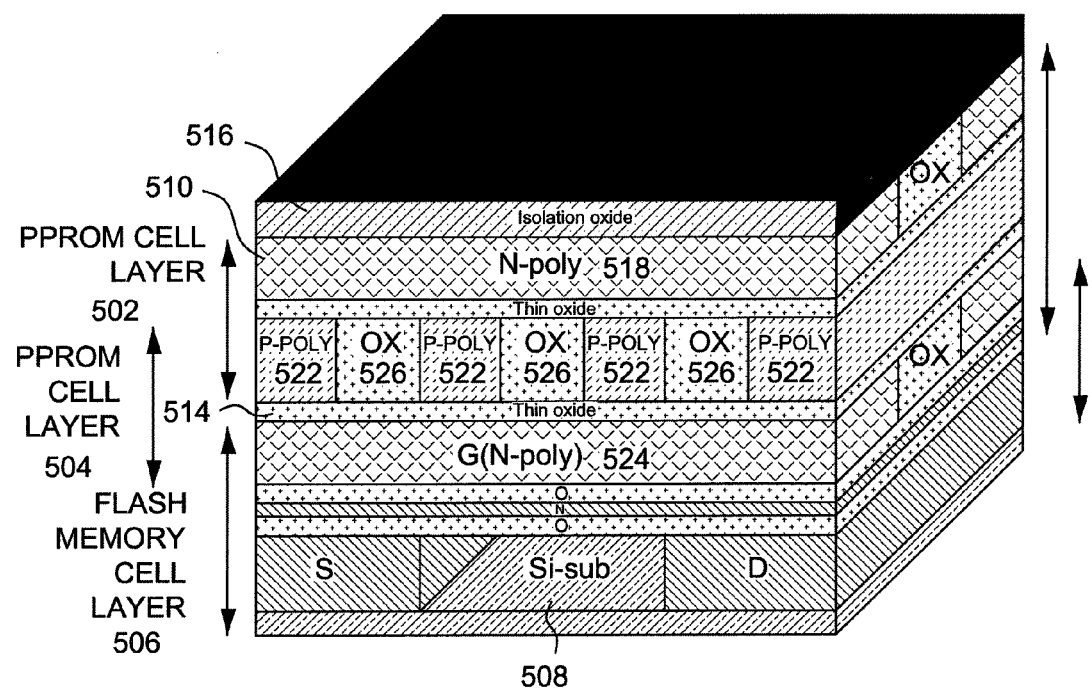
FIG. 5 is a diagram illustrating another example memory structure 300 that combines PPROM with flash memory in accordance with one embodiment.

In order to increase the PPROM density, three-dimensional PPROM structures can be implemented in accordance with the systems and methods described herein. For example, FIG. 5 is a diagram illustrating a memory structure 500 comprising a three-dimensional PPROM structure and a flash memory in accordance with one embodiment of the systems and methods described herein. memory structure 500 comprises a PPROM layer 502 and a second PPROM layer 504 above a flash memory cell layer 506.

PPROM layer 502 is constructed from an N-type poly-silicon layer 518 separated from P-type poly-silicon areas 522 by a thin oxide layer 520. Each poly diode 510 within PPROM layer 502 is then separated by oxide layers 526. An isolation oxide layer 516 can also be placed on top of the structure.

PPROM layer 504 then makes use of the same P-type poly-silicon area 522 separated by oxide areas 526. Poly diodes 512 comprising PPROM layer 504 also make use of N-type poly-silicon layer 524, which is separated from P-type poly-silicon areas 522 by thin oxide layer 514. In the embodiment of FIG. 5, N-type poly-silicon layer 524 is co-used with flash cell layer 506 to form a flash cell 508 as illustrated.

Figure 6:
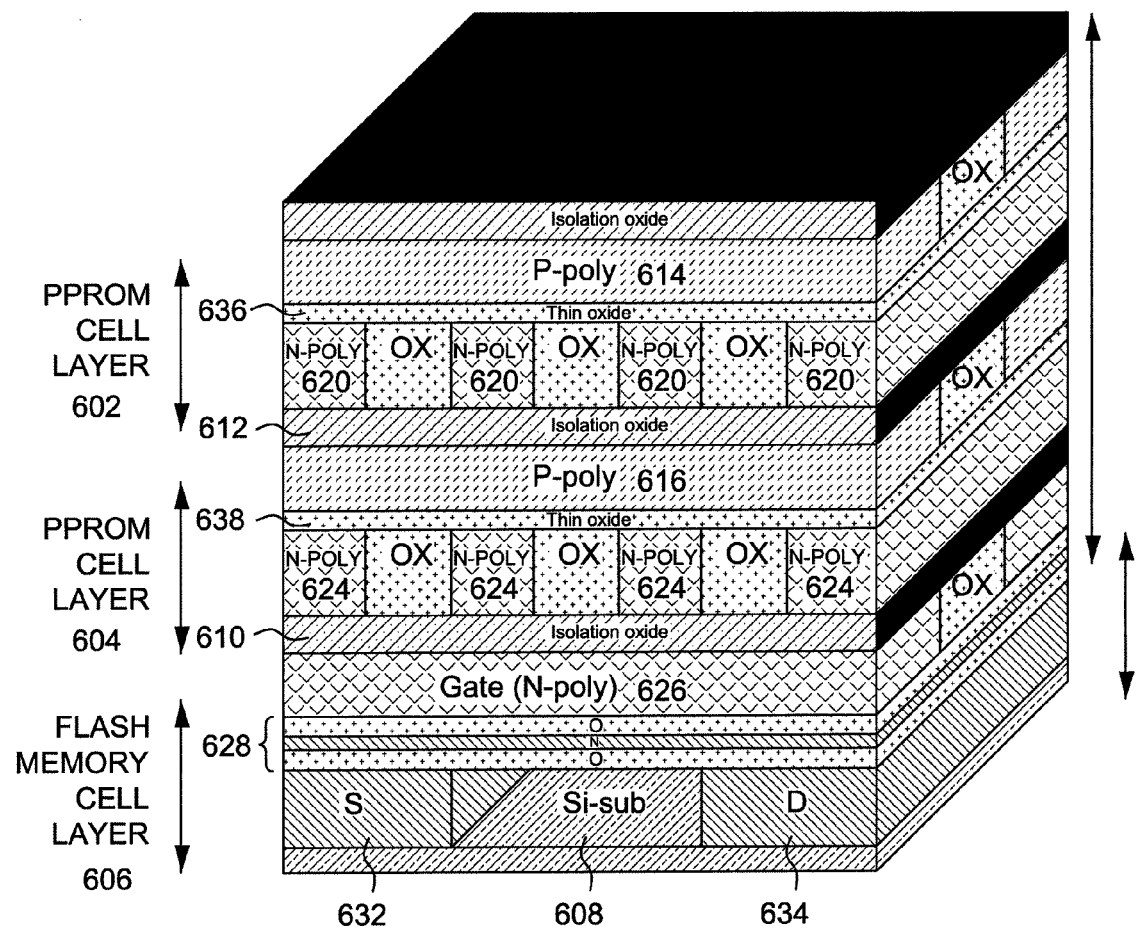
FIG. 6 is a diagram illustrating another example memory structure 300 that combines PPROM with flash memory in accordance with one embodiment.

FIG. 6 is a diagram illustrating an example memory structure 600 that includes a three-dimensional PPROM structure in accordance with another embodiment of the systems and methods described herein. Structure 600 comprises a first PPROM layer 602, a second PPROM layer 604, and a flash memory cell layer 606. Unlike the embodiment of FIG. 5, poly diodes 614, comprising PPROM layer 602, and poly diode 616, comprising PPROM layer 604, do not share any co-used poly-silicon lines.

Thus, as can be seen, poly diodes 614 comprising PPROM layer 602 are constructed from P-type poly-silicon layer 618 separated from N-type poly-silicon area 620 by thin oxide layer 636. Poly diode 616 comprising PPROM layer 604 are constructed from P-type poly-silicon layer 622 and N-type poly-silicon layer 624, separated by thin oxide layer 638. An isolation oxide layer 612 separates layer 602 and 604 such that there are no co-used poly-silicon lines.

Flash memory cell layer 606 comprises flash cell 608 constructed from N-type poly-silicon layer 626, ONO layer 628, and silicon substrate 630 with source and drain regions 632 and 634 respectively. Thus, there are no co-used poly-silicon layers common to PPROM layer 604 and flash memory cell layer 606.

FIGS. 3-6 illustrates specific implementations of a memory structure that comprises PPROM and flash memory in accordance with the systems and methods described herein. It will be clear, however, that the systems and methods described herein are not limited solely to the implementations illustrated in FIGS. 3-6. For example, other implementations can use co-used poly-silicon lines or not use co-used poly-silicon lines in ways not illustrated by the embodiments of FIGS. 3-6.

Depending on the embodiment, the bottom flash memory can be used, e.g., as an error replacement cell, or a memory storage cell. The use of the flash memory cell will be dependent on the specific implementation. Thus, the specific requirements of a particular implementation will dictate how the flash memory cells used.

FIGS. 7A-7D illustrate an example method for fabricating a memory structure comprising PPROM and flash memory cells in accordance with one of the embodiment of the systems and methods described herein. The process begins in FIG. 7A with a deposition of an ONO layer 702 on top of silicon substrate 706. Next, photo resist 704 is deposited on top of ONO layer 702 as illustrated. In the next step, photo resist 704 is photo defined. Electron implantation then is used to define the source 708 and drain 710 within silicon substrate 706.

Figure 7A:
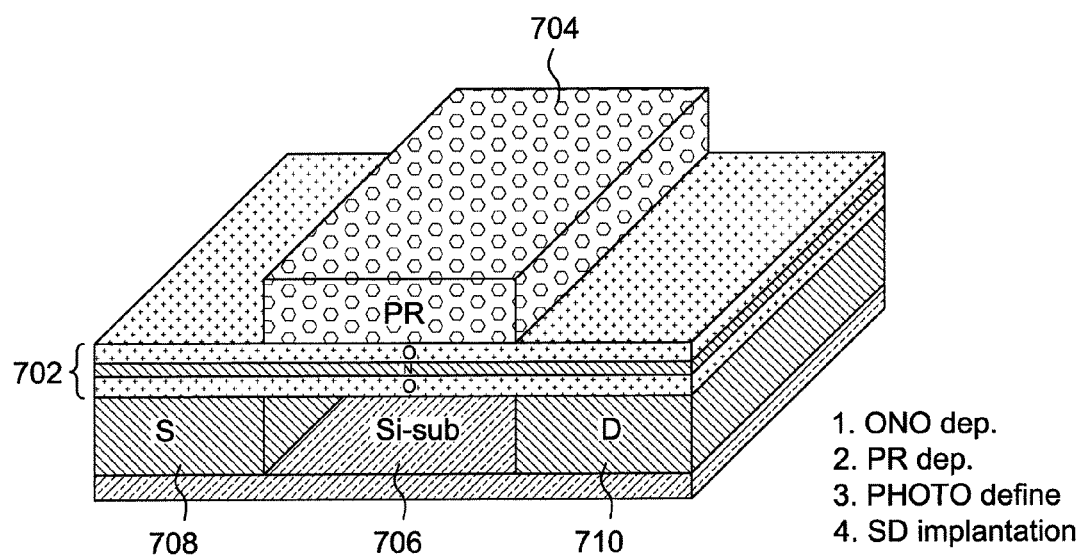
FIGS. 7A-7D illustrate an example method for fabricating a memory structure comprising PPROM and flash memory cells in accordance with one of the embodiment.
Figure 7B:
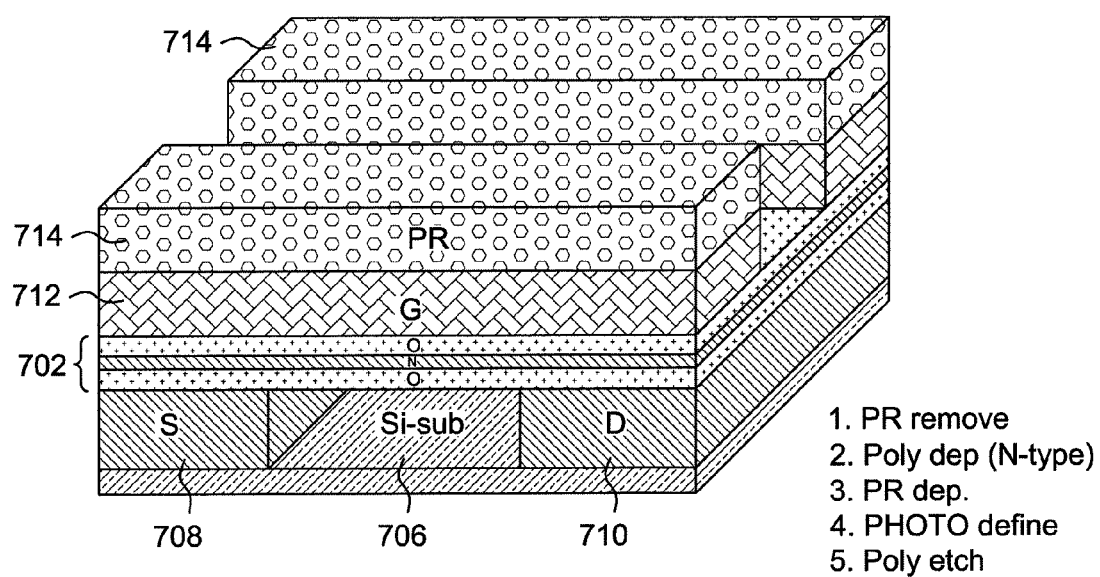
Figure 7C:
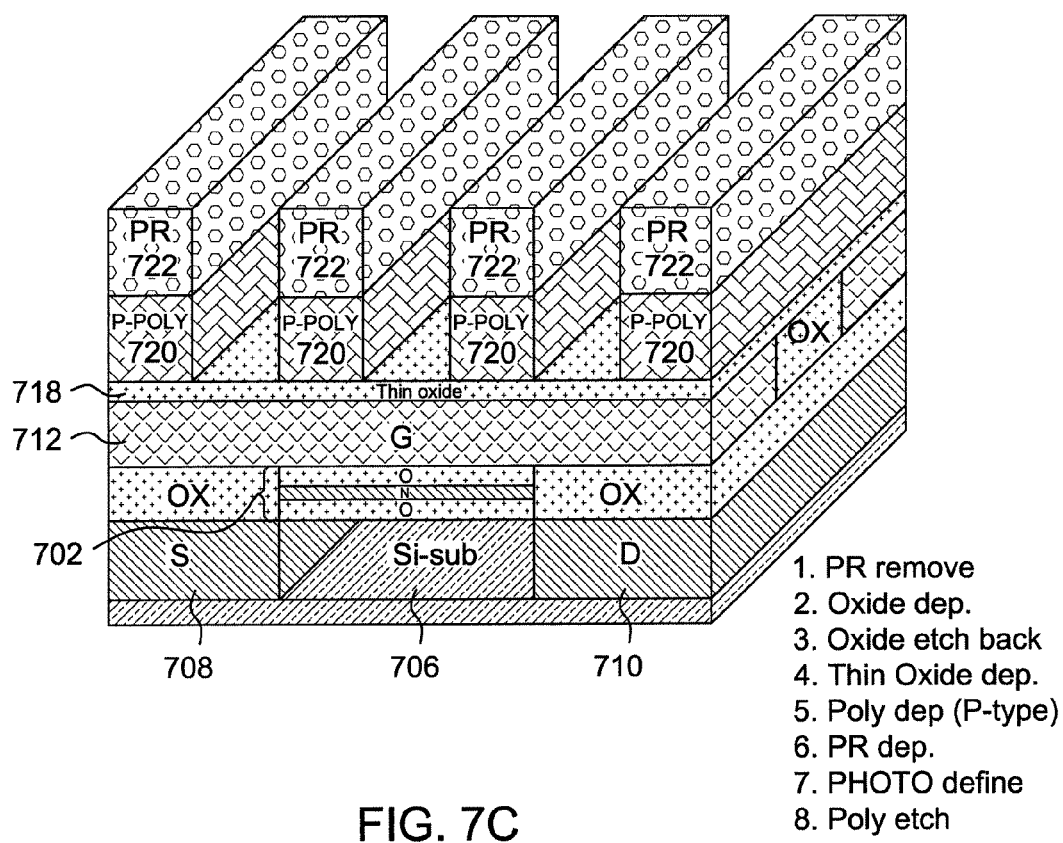

Next, as illustrated in FIG. 7B, photo resist layer 704 is removed and a poly-silicon layer, in this case N-type layer 712, is deposited. It will be understood that poly-silicon layer 712 will be deposited in areas defined by the photo definition process described above. Next, photo resist layer 714 is then deposited on top of poly-silicon layer 712 and photo resist layer 714 is photo defined. Poly-silicon layer 712 can then be poly etched as required.

In the next step, photo resist layer 714 can be removed. This step can be followed by the deposition of oxide layer 716. Oxide layer 716 can then be etched back, and this can be followed by the deposition of thin oxide layer 718. Next, P-type poly-silicon layer 720 can be deposited and photo resist layer 722 can be deposited above poly-silicon layer 720 as illustrated. Photo resist layer 722 can then be photo defined, and poly-silicon layer 720 can be poly etched in accordance with the requirements of the particular design.

Figure 7D:
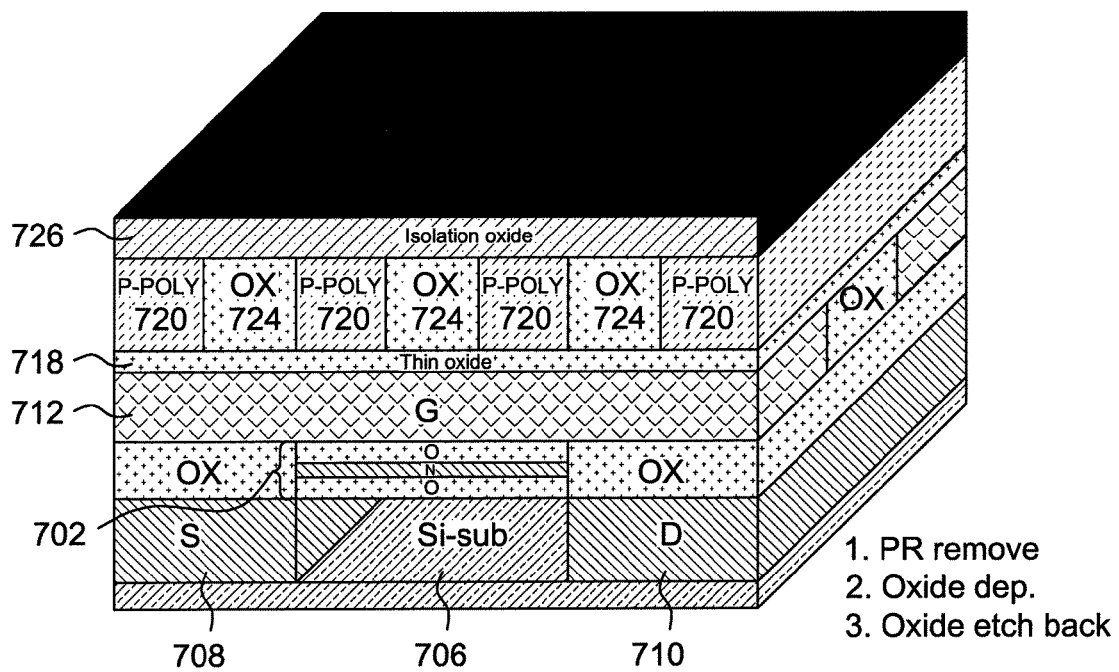

Next, as illustrated in FIG. 7d, photo resist layer 722 can be removed and oxide layer 724 can then be etched back. Isolation oxide layer 726 can then be deposited on top of the structure as shown.

The process illustrated by FIG. 7a-7d is just one example process for fabricating a memory structure that includes PPROM and flash memory cells in accordance with the systems and methods described herein. It will be understood that other fabrication processes and techniques can be used in order to achieve a memory structure that includes PPROM and flash memory cells configured as described herein.

Figure 8A:
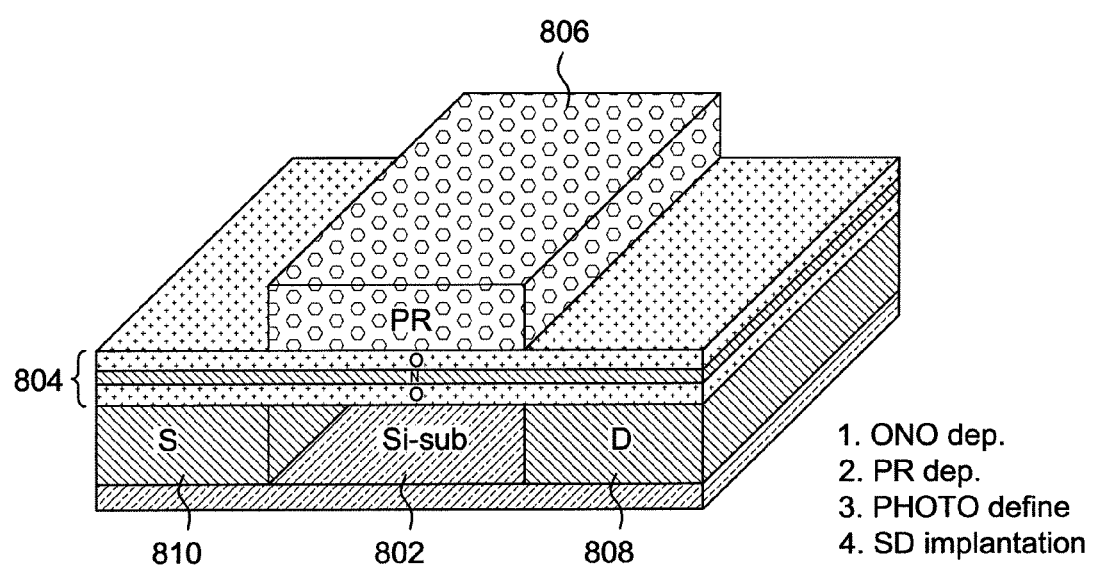
FIGS. 8A-8D illustrate an example method for fabricating a memory structure comprising PPROM and flash memory cells in accordance with one of the embodiment.
Figure 8B:
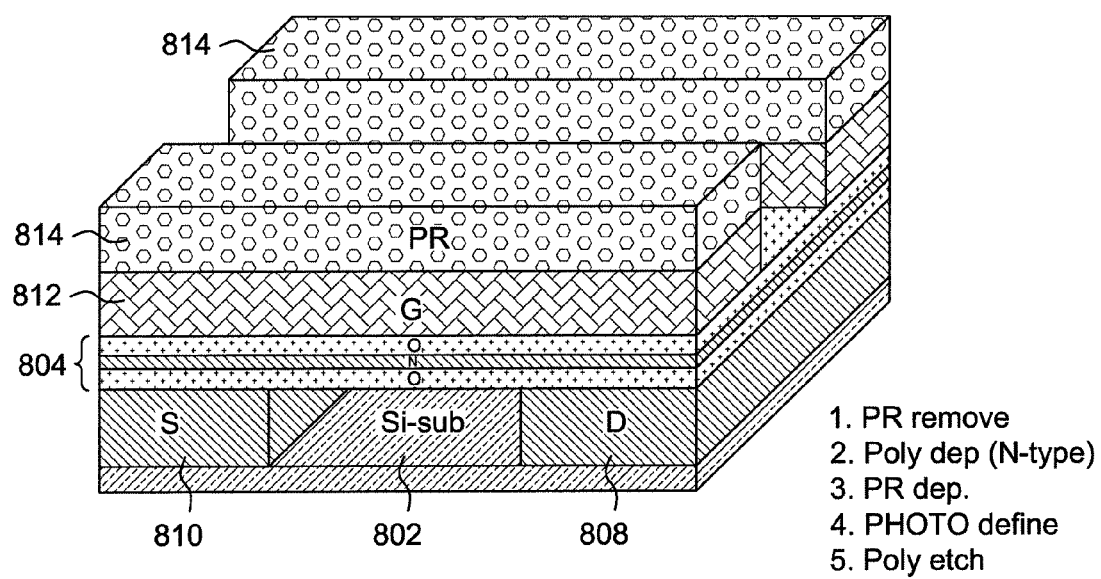
Figure 8C:
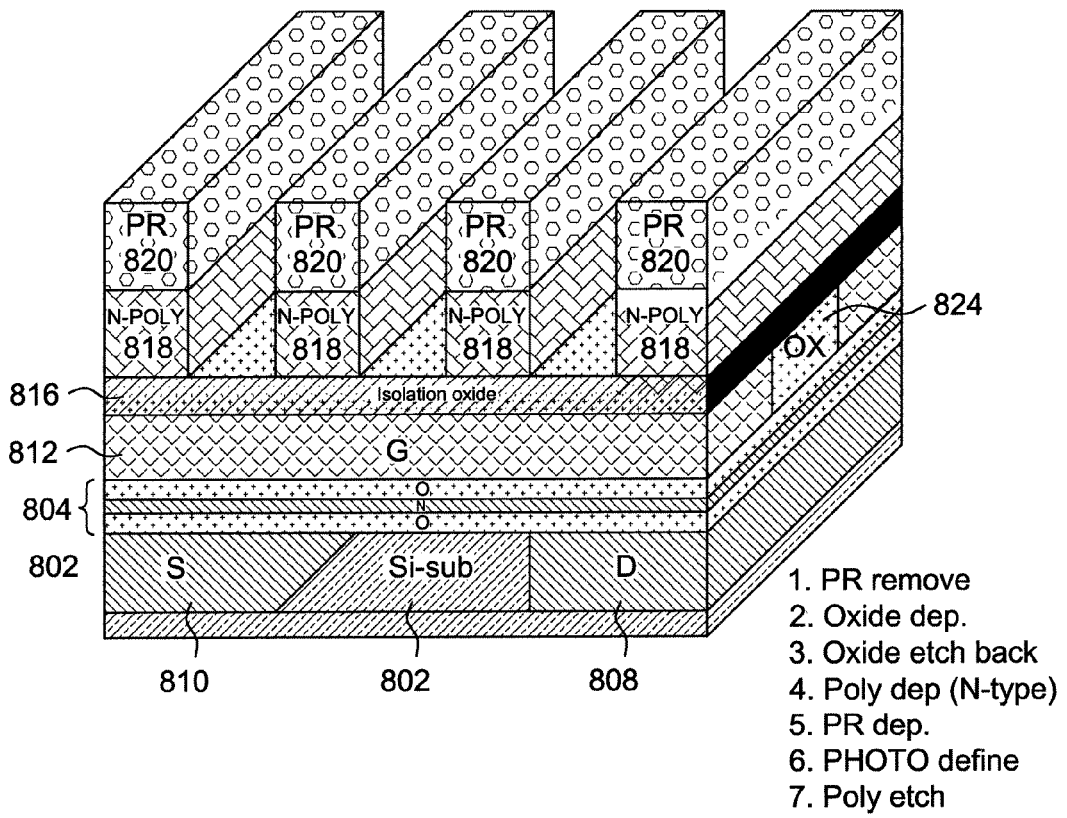

For example, FIGS. 8a-8c illustrate one alternative method for fabricating a memory structure that includes PPROM and flash memory cells in accordance with the systems and methods described herein. First, as illustrated in FIG. 8a, an ONO layer 804 can be deposited on a silicon substrate 802. A photo resist layer 806 can then be deposited on top of ONO layer 804, and then photo resist layer 806 can be photo defined in the next step. This can be followed by implantation of source 810 and drain 808 within silicon substrate 802.

Next, as illustrated in FIG. 8b, photo resist layer 806 can be removed and N-type poly-silicon layer 812 can be deposited on top of ONO layer 804. Photo resist layer 814 can then be deposited on top of poly-silicon layer 812 and photo resist layer 814 can then be photo defined in the next step. This can be followed by poly etching of poly-silicon layer 812.

Then, as illustrated in FIG. 8c, photo resist layer 814 can be removed and oxide layer 824 can be deposited and etched back in the following steps. After oxide layer 824 is etched back, N-type poly-silicon 818 can be deposited on top of an isolation oxide layer 816 as shown. Photo resist layer 820 can then be deposited and photo defined. This can be followed by poly etching of poly-silicon layer 818.

Figure 8D:
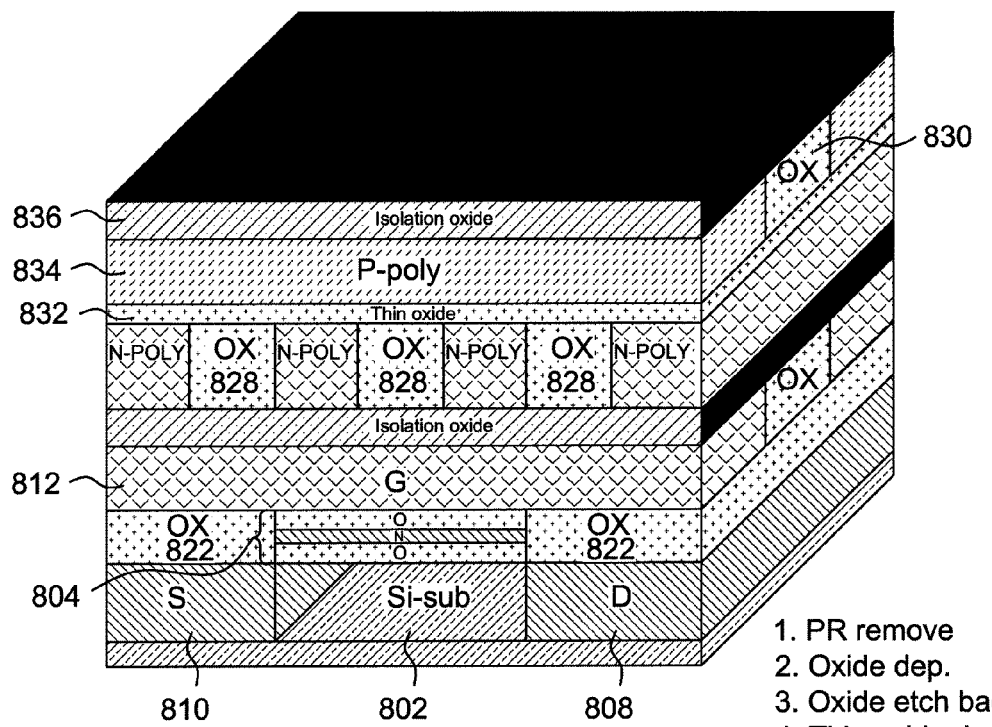

Next, as illustrated in FIG. 8d, photo resist layer 820 can be removed, oxide layers 828 and 830 can be deposited and etched back followed by deposition of thin oxide layer 832. P-type poly-silicon layer 834 can then be deposited. This can then be followed by the deposition of another photo resist layer, which can then be photo defined. This can be followed by poly etching of poly-silicon layer 834, and the deposition of isolation oxide layer 836, which can then be etched back in the following step.

Thus, the fabrication process illustrated in FIGS. 8a-8d illustrate an example process for fabricating a PPROM and flash memory cell structure in which the PPROM and flash memory cell structures do not share any co-used poly-silicon lines. Again, it will be understood that the process of FIGS. 8a-8d serve as an example only and that other processes and techniques are possible.

While certain embodiments of the inventions have been described above, it will be understood that the embodiments described are by way of example only. Accordingly, the inventions should not be limited based on the described embodiments. Rather, the scope of the inventions described herein should only be limited in light of the claims that follow when taken in conjunction with the above description and accompanying drawings.

What is claimed:

1. A method for fabricating a memory structure comprising a PPROM cell layer and a flash memory cell layer, comprising:
    fabricating a flash memory cell comprising forming an ONO layer on top of a silicon substrate, patterning the ONO layer, and forming a source and drain region in the silicon substrate; and
    fabricating a PPROM cell layer on top of the fabricated flash memory cell.

2. The method of claim 1, wherein fabricating the flash memory cell further comprises forming an N-type poly-silicon layer on top of the ONO layer.

3. The method of claim 2, wherein fabricating the PPROM cell layer further comprises patterning the N-type poly-silicon layer, depositing oxide layers, and removing part of the deposited oxide layers.

4. The method of claim 3, wherein fabricating the PPROM cell layer further comprises forming thin oxide layer on top of the N-type poly-silicon layer, and forming a P-type poly-silicon layer on top of thin oxide layer.

5. The method of claim 4, wherein fabricating the PPROM cell layer further comprises patterning the P-type poly-silicon layer.

6. The method of claim 5, wherein fabricating the PPROM cell layer further comprises forming an oxide layer within the P-type poly-silicon layer, and removing part of the oxide layer.

7. The method of claim 6, wherein fabricating the flash memory cell further comprises forming an N-type poly-silicon layer on top of the ONO layer, and patterning the N-type poly-silicon layer.

8. The method of claim 7, wherein fabricating the PPROM cell layer further comprises forming an oxide layer within the N-type poly-silicon layer, removing part of the oxide layer, and forming an isolation oxide layer on top of the N-type poly-silicon layer.

9. The method of claim 8, wherein fabricating the PPROM cell layer further comprises forming an N-type poly-silicon layer on top of the isolation oxide layer, and patterning the N-type poly-silicon.

10. The method of claim 9, wherein fabricating the PPROM cell layer further comprises forming an oxide layer within the N-type poly-silicon layer, removing part of the oxide layer formed within the N-type poly-silicon layer, and forming a thin oxide layer on top of the N-type poly-silicon layer.

11. The method of claim 10, wherein fabricating the PPROM cell layer further comprises forming a P-type poly-silicon layer on top of the thin oxide layer, and patterning the P-type poly-silicon layer.

12. The method of claim 11, wherein fabricating the PPROM cell layer further comprises forming an oxide layer in the P-type poly-silicon layer, removing part of the oxide layer formed within the P-type poly-silicon layer, and forming an isolation oxide layer on top of the P-type poly-silicon layer.

13. A method for fabricating a memory structure, the method comprising:
   fabricating a SONOS cell layer; and
   fabricating a PPROM cell layer comprising a plurality of diode cells on top of the fabricated SONOS cell layer.

* * * * *